United States Patent [19]

Lesh

[11] Patent Number: 4,677,629
[45] Date of Patent: Jun. 30, 1987

[54] MEANS FOR PHASE LOCKING THE OUTPUTS OF A SURFACE EMITTING LASER DIODE ARRAY

[75] Inventor: James R. Lesh, Pasadena, Calif.

[73] Assignee: The United States of America as represented by the Administrator of the National Aeronautics and Space Administration, Washington, D.C.

[21] Appl. No.: 781,812

[22] Filed: Sep. 30, 1985

[51] Int. Cl.⁴ ............................................. H01S 3/098
[52] U.S. Cl. ..................................... 372/18; 372/103; 372/43; 350/3.73; 350/3.81
[58] Field of Search .................... 372/103, 18, 31, 43, 372/44, 50; 350/3.73, 3.81

[56] References Cited

U.S. PATENT DOCUMENTS

| | | | |
|---|---|---|---|
| 3,452,296 | 6/1969 | Lockenvitz et al. | 331/94.5 |
| 3,577,093 | 5/1971 | Simpson | 331/94.5 |
| 3,579,142 | 5/1971 | Smiley | 331/94.5 |
| 3,586,995 | 6/1971 | Hubach | 331/94.5 |
| 3,593,190 | 7/1971 | Reinberg | 331/94.5 |
| 3,602,838 | 8/1971 | Stern | 331/94.5 |
| 3,691,483 | 9/1972 | Klein | 332/7.51 |
| 3,704,377 | 11/1972 | Lehovec | 331/94.5 |
| 3,704,427 | 11/1972 | Heywang | 331/94.5 |
| 3,763,441 | 10/1973 | Roess | 331/94.5 |
| 3,794,929 | 2/1974 | Carr | 330/4.3 |
| 3,835,414 | 9/1974 | Ahearn | 331/94.5 |
| 3,970,963 | 7/1976 | Chester | 331/94.5 |
| 4,096,448 | 6/1978 | Hayes | 372/18 |
| 4,221,468 | 9/1980 | Macken | 350/292 |
| 4,246,548 | 1/1981 | Rutz | 372/44 |
| 4,321,551 | 3/1982 | Bleil et al. | 330/4.3 |
| 4,479,221 | 10/1986 | Kitamura | 372/75 |

OTHER PUBLICATIONS

Chow; "Phase Locking Lasers by an Injected Signal"; Opt. Lett., vol. 7, No. 9, Sep. 1982; p. 417.
A. Ibaraki, et al., "GaAlAs/GaAs Surface≧Emitting Injection Laser" Thirteenth International Quantum Electronics Conference, Jun. 18, 1984, pp. 49–50.

Primary Examiner—Leon Scott, Jr.
Attorney, Agent, or Firm—Paul F. McCaul; John R. Manning; Thomas H. Jones

[57] ABSTRACT

An array of diode lasers, either a two-dimensional array of surface emitting lasers, or a linear array of stripe lasers, is phase locked by a diode laser through a hologram which focuses the output of the diode laser into a set of distinct, spatially separated beams, each one focused onto the back facet of a separate diode laser of the array. The outputs of the diode lasers thus form an emitted coherent beam out of the front of the array.

3 Claims, 5 Drawing Figures

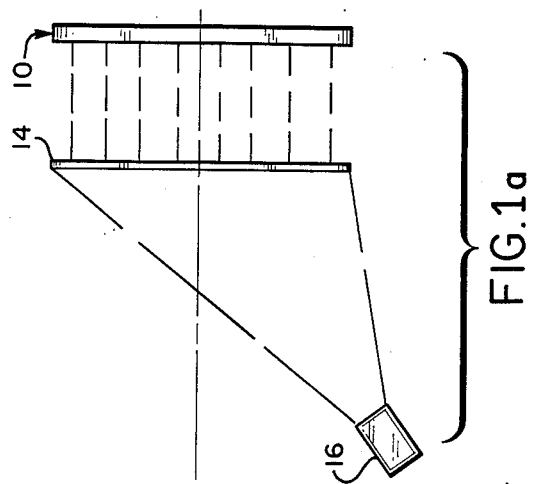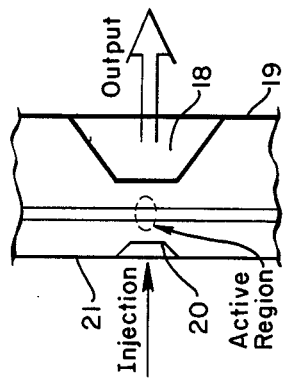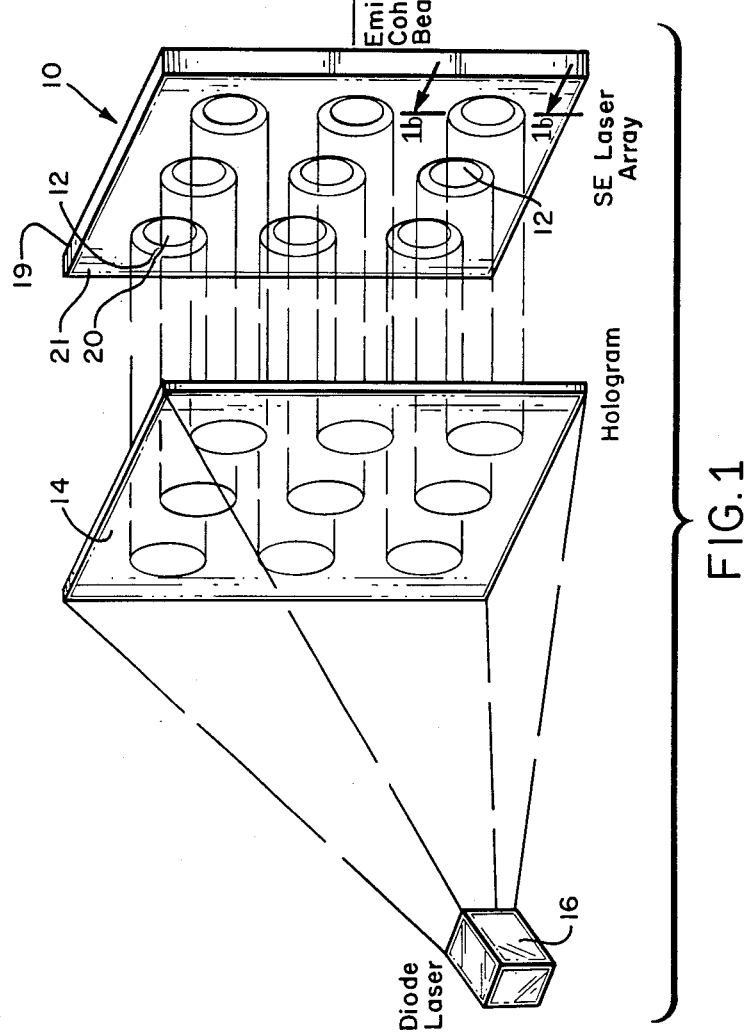

MEANS FOR PHASE LOCKING THE OUTPUTS OF A SURFACE EMITTING LASER DIODE ARRAY

ORIGIN OF INVENTION

The invention described herein was made in the performance of work under a NASA contract, and is subject to the provisions of Public Law 96-517 (35 USC 202) in which the Contractor has elected not to retain title.

BACKGROUND OF THE INVENTION

This invention relates to phase locking diode laser arrays, and more particularly to a technique for phase locking the outputs of the diode lasers in the array with inherent light from a master diode laser.

Diode lasers do not emit light with sufficient power for most applications, such as communications. Consequently, the practice has been to provide an array of edge emitting stripe lasers, typically 5 $\mu$m wide on 9 $\mu$m centers. These lasers are coupled for coherent operation, usually by techniques designed into the array structure. However, these edge emitting diode lasers are, at present, inherently one dimensional, with the lasing occurring parallel to the substrate. To increase the output power, it would be desirable to stack several of these linear arrays; the problem is to provide a way of causing them to operate in phase. Much work has been devoted to the analysis, development and fabrication of diode laser arrays. D. R. Scifres, R. D. Burnham and W. Streifer, "Phase-Locked Semiconductor Laser Array," Appl. Phys. Lett. Vol. 33, pp. 1015–1017, 1978; D. E. Ackley, "High Power Multiple Stripe Injection Lasers with Channel Guides," IEEE J. Quantum Electron., Vol. QE-18, pp. 1910–1917, 1982; E. Kapon, C. Lindsey, J. Katz, S. Margalit and A. Yariv, "Coupling Mechanism of Gain-Guided Integrated Semiconductor Laser Arrays," Appl. Phys. Lett. 44, Feb. 15, 1984.

A desirable property of such arrays is to have the output beams from each of the laser stripes phase coherent (relative to one another). Sometimes this phase coherence can be produced by simply placing the laser stripes close enough together. E. Kapon, J. Katz, C. Lindsey, S. Margalit and A. Yariv, "Control of Mutual Phase Locking of Monolithical Integrated Semiconductor Lasers," Appl. Phys. Lett. 43, pp. 421–42 (1983); J. Katz, E. Kapon, C. Lindsey, S. Margalit, U. Shreter and A. Yariv, "Phase Locked Semiconductor Laser Array with Separate Contacts," Appl. Phys. Lett. 43 pp. 521–523, (1983). However, such coupling can often lead to undesirable supermode patterns in the array far field. E. Kapon, J. Katz, and A. Yariv, "Supermode Analysis of Phase Locked Arrays of Semiconductor Lasers," Opt. Lett., Vol. 9., pp. 125–127, 1984.

A more positive method to achieve phase locking is via injection locking where a master laser is focused into the back facet region of the array, thereby injecting a phase coherent stimulus into all the array channels. Some success has been achieved experimentally using this technique. L. Goldberg, H. F. Taylor and J. F. Weller, "Optical Injection Locking of a GaAlAs Phase Coupled Laser Array," presented at XIII International Conference on Quantum Electronics, Postdeadline paper PD-B4, Anaheim, CA, June 12, 1984; J. Daher, "Injection Locking of an Incoherent Laser Array," Summer Internal Summary Report, Jet Propulsion Laboratory, August 1984. Since the array stripes (channels) are quite close together (usually about 9 $\mu$m spacing for a 5 $\mu$m channel), coupling of the master laser power into the array channels can be accomplished with reasonably high geometric efficiency using a cylindrical lens.

One of the major drawbacks of present laser diode arrays formed in a body of semiconductor material is that they are inherently one dimensional, as noted above. The laser channels are defined by laying down contact stripes on top of thinly grown layers deposited on a substrate. The channels are defined by contact stripes, or other means, such as index guiding of the lasing which occurs parallel to the substrate surface with outputs occurring at the edges of the sheet of grown layers. It is for that reason that these devices have been restricted to one-dimensional arrays.

One solution to the problem of providing more laser diodes in an array is to make a two-dimensional, surface-emitting (SE) array. Both GaAlAs/GaAs and GaInAsP/InP systems have been used to fabricate a surface-emitting injection laser. See A. Ibaraki, S. Ishikawa, S. Ohkouchi and K. Iga, "GaAlAs/GaAs Surface Emitting Injection Laser," Proceedings, Thirteenth International Quantum Electronic Conference, Anahiem, CA, June 18, 1984, paper MLL7, pages 49–50, S. Uchiyama and K. Iga, "Two Dimensional Array of Improved Gain AsP/InP Surface-Emitting Injection Lasers" and Proceedings, 1985 Conference on Lasers and Electro-optics, paper No. TUF6, page 45. In these devices, layers are first grown on a substrate. Then etched laser facets (pothole mirrors) are etched from the bottom (through the substrate) and laser facets are etched or otherwise provided on the top. In such devices, the lasing output occurs normal to the substrate surface.

Although such devices hold promise for two-dimensional structures, the separation between laser front facets (potholes) is usually 25 to 100 $\mu$m. This separation, along with the short laser cavity length, effectively prevents any phase coupling between the lasers. Thus, the only method by which this type of laser array could be phase locked is through injection locking. However, the geometric efficiency (i.e., aggregate area of the back facets divided by the area of the array) is extremely small. This is true to a lesser extent even of a linear array, so that it is difficult to use injection locking there as well because in both cases the geometry makes coupling a master laser into every diode of the array virtually impossible. So the problem is to phase synchronize the outputs of the diode lasers in the array such that the combined output is phase coherent and contains negligible far-field supermodes, i.e., produces a single lobe far-field pattern, using a master diode laser.

SUMMARY OF THE INVENTION

In accordance with the present invention, an array of diode lasers is provided with a single master diode laser for phase locking the outputs of the diode lasers through a hologram prepared to focus light into a set of distinct, spatially separated beams, each focused to direct light from the master diode onto an etched laser facet of each of the diode lasers of the array. The hologram is made using the same mask as used to photolithographically define the back laser facets. The same master diode laser, or one of substantially the same wavelength is used to produce the hologram in an otherwise conventional way. A beam splitter and a mirror are used to produce the necessary reference beam. This technique of making and using a hologram to focus beams of light from a master diode laser onto the back laser facets in an array has its greatest advantage for two-dimensional arrays, but may be used to advantage for linear arrays as well.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1 is a schematic diagram of one embodiment of the invention comprised of a two-dimensional array of surface emitting diode lasers and a master diode laser for phase locking all diode lasers utilizing separate beams formed by a hologram from the beam emitted by the laser diode.

FIG. 1a is a plan view of FIG. 1 illustrating the arrangement for optimum illumination of the hologram for the purpose at hand.

FIG. 1b is a cross section taken on a line b—b in FIG. 1.

DESCRIPTION OF PREFERRED EMBODIMENTS

Referring now to FIG. 1, a two-dimensional array 10 of surface emitting (SE) diodes 12, is excited by a separate beam of light formed by a hologram 14 from a beam emitted by a single diode laser 16. The hologram is prepared to focus the output of the master laser into a set of distinct, spatially separated beams, each one focused onto a separate etched facet in the back side of a laser array. Phase coherent light is thus emitted by all of the SE diode lasers because of the phase locking achieved by back lighting the SE diode lasers of the array with a reference beam at an angle as shown in FIG. 1a. The combined output of the laser array is phase coherent.

The requisite holographic technology is quite well known, and recently used for such purposes as commercial telephone equipment, namely a telephone credit card validating system using a hologram. When inserted into the telephone, and illuminated by a laser, a pattern of spatially separated beams is produced which the telephone is configured to recognize before it will validate the credit card. In the proposed laser array injection locking scheme, the hologram can also be configured to compensate for asymmetry in the output beam shape of the master diode, thereby eliminating the need for complex apodization optics, such as a prism pair.

Figure 3:
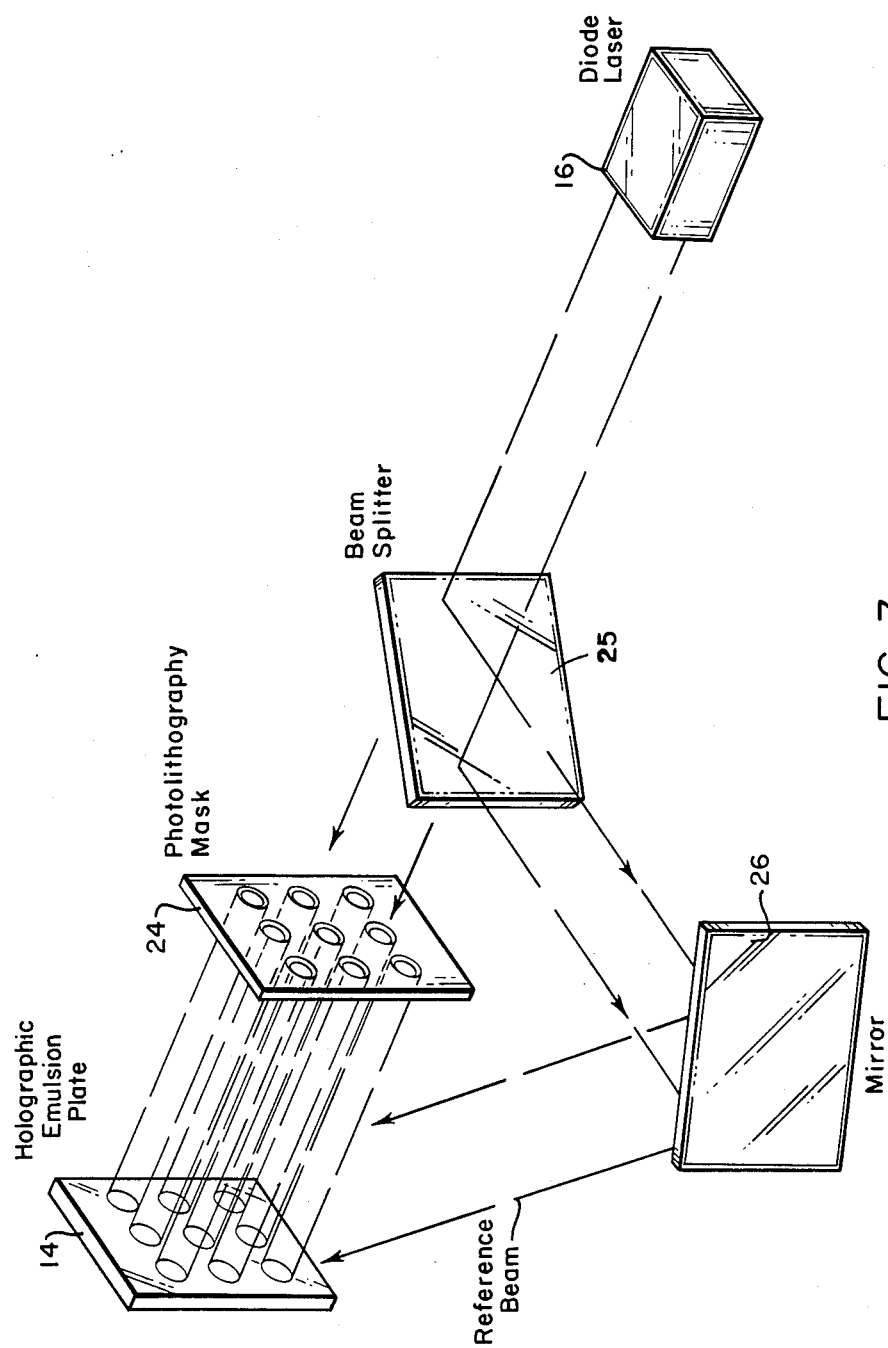
FIG. 3 illustrates schematically the manner in which a hologram is made from a template used to etch or otherwise form laser facets on the back of the array.

In producing the two-dimensional diode laser array 10, a mask is used to photolithographically etch laser facets (pothole mirrors) 18 on the front side 19, as shown in FIG. 1b. Another mask is similarly used to form laser facets 20 on the back 21. The photolithography mask used for the facets on the back is also used to produce the hologram 14 in an arrangement shown in FIG. 3 wherein that mask is identified by the reference numeral 24. Light from the diode laser 16, or another diode laser of substantially the same wavelength, provides coherent light used with a holographic emulsion plate 14 (an ordinary photographic plate) to produce an image of the front laser facets 20 from the mask 24. During exposure of the holographic emulsion plate, the coherent light is divided into two beams by a beam splitter 25. Part of the light is directed to illuminate the holographic emulsion plate through the mask 24, and part (a reference beam) is channeled by a mirror 26 to illuminate the holographic emulsion plate with a reference beam at an angle with respect to the direct beam. The two beams produce an interference pattern on the holographic emulsion plate which bears no resemblance to the pattern on the mask 24 until developed and again illuminated by a similar coherent reference beam, as shown in FIG. 1. Then there is produced an image of the photolithography mask 24 on the back of the array 10, with a separate beam focused on each facet 20. Since the facets are all thus illuminated by light from the same diode laser 16, the output of the laser array is a coherent beam made up from the in-phase outputs of the individual diode lasers of the array.

Figure 2:
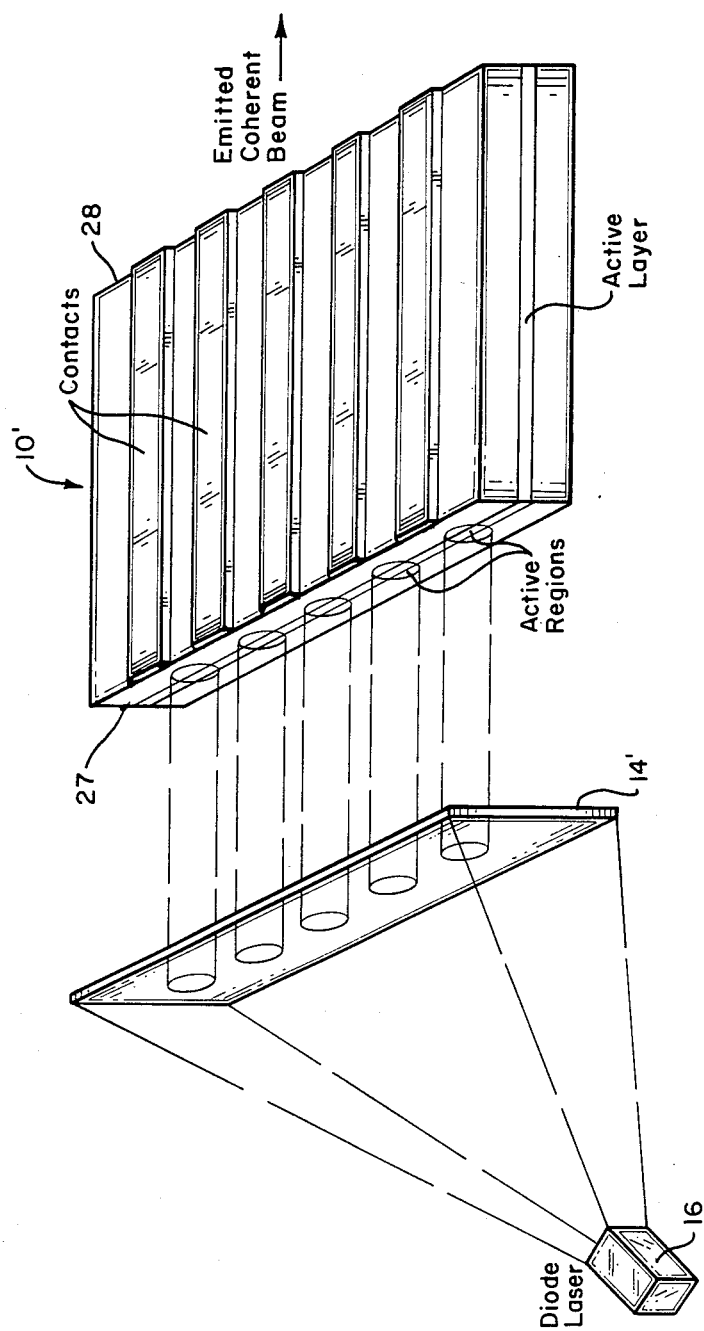
FIG. 2 is a schematic diagram of another embodiment of the invention comprised of a linear array of diode lasers and a master diode laser for phase locking all diode lasers utilizing separate beams formed by a hologram from the beam emitted by the laser diode.

A similar hologram 14' is formed in the same way for the linear array 10' of FIG. 2, shown as a contact stripe laser, although it could be made by other known stripe laser techniques such as the index guided stripe laser. The only difference is that the photolithography mask is not normally required to fabricate the array, so such a mask has to be produced for this purpose. The hologram 14' focuses a beam into the active region of each stripe laser from the back facet 27, and a coherent beam is emitted from the front facet 28.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. An array of injection phase-locked diode lasers utilizing as a master a separate laser source, and means for coupling light from said master laser source into each diode laser of said array of diode lasers, said array being fabricated in a body of semiconductor material, each diode laser having a back facet on one side of said body of semiconductor material and a front facet on an opposite side of said body of semiconductor material, said light coupling means comprising a hologram prepared for producing from the output of said master laser source a set of distinct, spatially separated beams, each one directed into the back facet of each diode laser, thereby to assure emission of phase coherent light from said array of diode lasers, said hologram being positioned between said master laser source and said one side of said body of semiconductor material, said hologram being prepared by illuminating a holographic emulsion plate with an image of said array of diode lasers using coherent light of substantially the same wavelength as said master laser source, and a coherent reference beam of substantially the same wavelength as said master laser source.

2. The combination as defined in claim 1 wherein said array of diode lasers is comprised of a rectangular array of surface emitting diode lasers.

3. The combination as defined in claim 1 wherein said array of diode lasers is comprised of a liner array of stripe lasers.

* * * * *